United States Patent
Ito et al.

(10) Patent No.: US 11,396,714 B2
(45) Date of Patent: Jul. 26, 2022

(54) TREATMENT DEVICE, PLATING APPARATUS INCLUDING THE SAME, CONVEYING DEVICE, AND TREATMENT METHOD

(71) Applicant: EBARA CORPORATION, Tokyo (JP)

(72) Inventors: Kenya Ito, Tokyo (JP); Hirohiko Ueda, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 320 days.

(21) Appl. No.: 16/462,431

(22) PCT Filed: Sep. 12, 2017

(86) PCT No.: PCT/JP2017/032775
§ 371 (c)(1),
(2) Date: May 20, 2019

(87) PCT Pub. No.: WO2018/096768
PCT Pub. Date: May 31, 2018

(65) Prior Publication Data
US 2019/0376203 A1 Dec. 12, 2019

(30) Foreign Application Priority Data
Nov. 22, 2016 (JP) .............................. JP2016-226807

(51) Int. Cl.
*C25D 17/06* (2006.01)
*C25D 21/00* (2006.01)
(Continued)

(52) U.S. Cl.
CPC .............. *C25D 17/06* (2013.01); *C25D 21/00* (2013.01); *H01L 21/6723* (2013.01); *H01L 21/6838* (2013.01)

(58) Field of Classification Search
None
See application file for complete search history.

(56) References Cited

U.S. PATENT DOCUMENTS 6,971,835 B2 * 12/2005 Ishibashi ............. C23C 16/4412
                                                            118/725
8,865,474 B2 * 10/2014 Paschetto ............... G01N 35/04
                                                            436/177
(Continued)

FOREIGN PATENT DOCUMENTS

JP    H05-036658 A    2/1993
JP    3042598 B2    5/2000
(Continued)

OTHER PUBLICATIONS

International Search Report issued in PCT/JP2017/032775, dated Nov. 28, 2017, 1 page.

*Primary Examiner* — Stefanie S Wittenberg
(74) *Attorney, Agent, or Firm* — Weihrouch IP

(57) ABSTRACT

To stably convey a substrate (workpiece) while suppressing the workpiece from bending. A treatment device is provided. This treatment device includes: a conveying part that conveys a workpiece in a state where a flat surface of the workpiece is inclined around a conveying directional axis relative to a horizontal plane; and a treatment part in which at least one of polishing and cleaning is performed on the flat surface of the workpiece, wherein the conveying part has a drive part configured to be brought into physical contact with an end part of the workpiece and apply force in a conveying direction to the workpiece, a first Bernoulli chuck arranged to face the flat surface of the workpiece, and a second Bernoulli chuck arranged to face an end face of an opposite end part to the end part of the workpiece.

17 Claims, 11 Drawing Sheets

(51) Int. Cl.
   *H01L 21/67*   (2006.01)
   *H01L 21/683*  (2006.01)

(56) References Cited

U.S. PATENT DOCUMENTS

| | | | |
|---|---|---|---|
| 2010/0006444 | A1 | 1/2010 | Endo |
| 2014/0342092 | A1* | 11/2014 | Andreae ............ B65G 49/0459 |
| | | | 427/430.1 |
| 2015/0000056 | A1 | 1/2015 | Togawa et al. |
| 2016/0039223 | A1* | 2/2016 | Shapira ................... B65H 5/04 |
| | | | 347/14 |

FOREIGN PATENT DOCUMENTS

| | | | |
|---|---|---|---|
| JP | 2002-261143 A | 9/2002 | |
| JP | 2004-123254 A | 4/2004 | |
| JP | 2009-263077 A | 11/2009 | |
| JP | 2010-018841 A | 1/2010 | |
| JP | 2011-236489 A | 11/2011 | |
| KR | 2008-0085646 A | 9/2008 | |
| KR | 20120059700 A | 6/2012 | |
| KR | 10-2015-0002483 A | 1/2015 | |
| WO | WO-2006126455 A1 * | 11/2006 | ............. B24B 21/04 |
| WO | WO-2016052632 A1 * | 4/2016 | ......... H01L 21/6835 |

\* cited by examiner

Fig. 5

STEPWISE FEED OF SUBSTRATE

TRAVERSE (CONTINUOUS) FEED OF SUBSTRATE

TREATMENT DEVICE, PLATING APPARATUS INCLUDING THE SAME, CONVEYING DEVICE, AND TREATMENT METHOD

CROSS REFERENCE TO RELATED APPLICATION

This application is a 35 U.S.C. 371 National Phase Entry Application from PCT/JP2017/032775, filed Sep. 12, 2017, which claims priority to Japanese Patent Application No. 2016-226807, filed Nov. 22, 2016, the disclosures of which are incorporated herein in their entirety by reference, and priority is claimed to each of the foregoing.

TECHNICAL FIELD

The present invention relates to a treatment device, a plating apparatus including the same, a conveying device, and a treatment method.

BACKGROUND ART

Wires, bumps (bump electrodes) and the like have been conventionally formed on the surface of a substrate such as a semiconductor wafer or a printed circuit board. An electroplating method is known as a method of forming such wires, bumps and the like.

By a plating apparatus used for the electroplating method, a plating treatment is performed generally on a circular substrate such as a wafer having 300 mm of diameter. Nevertheless, there has been a demand for subjecting not only such a circular substrate but also a rectangular substrate to cleaning, polishing, plating or the like in recent years. Such a rectangular substrate is formed, for example, by bonding chips formed from a circular wafer, and the like on one side or both sides of a substrate composed of a resin material.

Now, it is known that in conveyance of substrates, the substrates are conveyed in their upright postures in order to reduce an area for installing a conveying device (for example, see Patent Literature 1). Moreover, such upright postures of substrate enable efficient liquid draining on the surfaces of the substrates when performing a treatment such as cleaning or polishing, which needs liquid, during conveyance of the substrates.

CITATION LIST

Patent Literature

PTL 1: Japanese Patent No. 3042598

SUMMARY OF INVENTION

Technical Problem

However, with the conveying device disclosed in Patent Literature 1, since the upper end part of a substrate is a free end (the upper end part of the substrate is not held), the substrate possibly bends in the upright position of the substrate when the rigidity of the substrate is low. Moreover, when the weight of the substrate is relatively small, the substrate is shakily conveyed due to minute steps or the like between conveying rollers and possibly intermittently parts from the conveying rollers. In such a case, the substrate is not properly in contact with the conveying rollers, which occasionally disables its conveyance at a stable speed. Such a problem can similarly arise on a circular substrate as well as on a rectangular substrate.

The present invention is devised in view of the aforementioned problem, and an object thereof is to stably convey a substrate (workpiece) while the workpiece is suppressed from bending.

Solution to Problem

According to an aspect of the present invention, a treatment device is provided. This treatment device includes: a conveying part that conveys a workpiece in a state where a flat surface of the workpiece is inclined around a conveying directional axis relative to a horizontal plane; and a treatment part in which at least one of polishing and cleaning is performed on the flat surface of the workpiece. The conveying part has a drive part configured to be brought into physical contact with an end part of the workpiece and apply force in a conveying direction to the workpiece, a first Bernoulli chuck arranged to face the flat surface of the workpiece, and a second Bernoulli chuck arranged to face an end face of an opposite end part to the end part of the workpiece.

According to an aspect of the present invention, there is provided a conveying device which conveys a workpiece in a state where a flat surface of the workpiece is inclined around a conveying directional axis relative to a horizontal plane. This conveying device includes: a drive part configured to be brought into physical contact with an end part of the workpiece and apply force in a conveying direction to the workpiece; a first Bernoulli chuck arranged to face the flat surface of the workpiece; and a second Bernoulli chuck arranged to face an end face of an opposite end part to the end part of the workpiece.

According to an aspect of the present invention, a treatment method is provided. This treatment method includes: a step of conveying a workpiece in a state where a flat surface of the workpiece is inclined around a conveying directional axis relative to a horizontal plane; and a treatment step of performing at least one of polishing and cleaning on the flat surface of the workpiece. The step of conveyance includes a step of physically applying force in a conveying direction to an end part of the workpiece, a step of holding the flat surface of the workpiece with a first Bernoulli chuck so as to limit movement of the workpiece in a thickness direction, and a step of holding an end face of an opposite end part to the end part of the workpiece with a second Bernoulli chuck so as to limit movement of the workpiece in an in-plane direction perpendicular to the conveying direction.

BRIEF DESCRIPTION OF DRAWINGS

FIG. 5 is a schematic lateral cross-sectional view of the cleaning device according to another mode.

DESCRIPTION OF EMBODIMENTS

Figure 1:
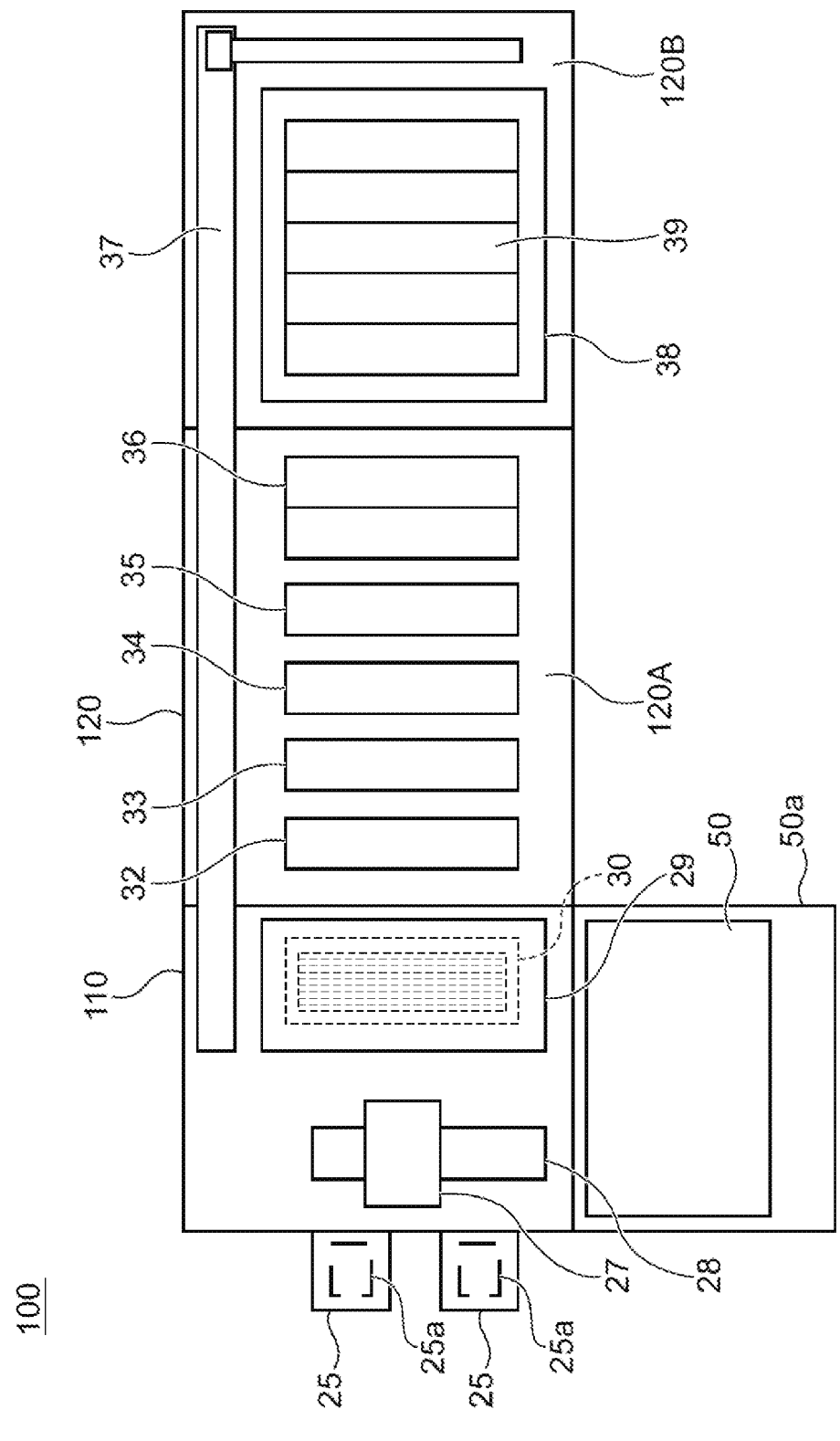
FIG. 1 is an overall arrangement diagram of a plating apparatus including a treatment device according to an embodiment.

Hereafter, embodiments of the present invention are described with reference to the drawings. In the drawings described below, the same or corresponding components are given the same signs and their duplicate description is omitted. FIG. 1 is an overall arrangement diagram of a plating apparatus including a treatment device according to the present embodiment. The plating apparatus according to the present embodiment has a cleaning device 50 as an example of the treatment device. As shown in FIG. 1, this plating apparatus 100 is roughly divided into a loading/unloading part 110 which loads substrates (each of which exemplarily corresponds to a workpiece) onto a substrate holder or unloads the substrates from the substrate holder, a treatment part 120 in which the substrates are treated, and a cleaning part 50a. The treatment part 120 further includes a pre-treatment/post-treatment part 120A in which a pre-treatment and a post-treatment is performed on the substrates, and a plating treatment part 120B in which a plating treatment on the substrates is performed. The loading/unloading part 110, the treatment part 120 and the cleaning part 50a of the plating apparatus 100 are individually enclosed by separate frames (casings). Notably, the substrates treated by this plating apparatus 100 include rectangular substrates and circular substrates. Moreover, the rectangular substrates include rectangular printed circuit boards, other plating objects, and the like.

The loading/unloading part 110 has two cassette tables 25, and a substrate attaching/detaching mechanism 29. The cassette table 25 has a cassette 25a thereon which houses substrates such as semiconductor wafers or printed circuit boards. The substrate attaching/detaching mechanism 29 is configured to attach/detach the substrates onto/from the substrate holder not shown. Moreover, a stocker 30 for housing the substrate holder is provided close to the substrate attaching/detaching mechanism 29 (for example, under the same). A substrate conveying device 27 composed of a conveying robot which conveys the substrates between these units 25, 29 and 30 is arranged at the center among these units. The substrate conveying device 27 is configured to be able to travel with a travelling mechanism 28.

The cleaning part 50a has the cleaning device 50 (exemplarily corresponding to the treatment device) which cleans and dries a substrate subjected to a plating treatment. The substrate conveying device 27 is configured to convey the substrate subjected to the plating treatment to the cleaning device 50 and to take out the substrate having been cleaned and dried from the cleaning device 50. Details of the cleaning device 50 are described with FIG. 2 mentioned later.

The pre-treatment/post-treatment part 120A has a prewetting bath 32, a presoaking bath 33, a prerinsing bath 34, a blowing bath 35 and a rinsing bath 36. In the prewetting bath 32, a substrate is immersed in pure water. In the presoaking bath 33, an oxide film on the surface of a conductive layer such as a seed layer formed on the surface of the substrate is etched and removed. In the prerinsing bath 34, the substrate subjected to presoaking is cleaned along with the substrate holder with cleaning liquid (pure water or the like). In the blowing bath 35, liquid graining is performed on the substrate subjected to cleaning. In the rinsing bath 36, the substrate subjected to plating is cleaned along with the substrate holder with cleaning liquid. The prewetting bath 32, the presoaking bath 33, the prerinsing bath 34, the blowing bath 35 and the rinsing bath 36 are arranged in this order.

The plating treatment part 120B has a plurality of plating baths 39 including an overflow bath 38. Each plating bath 39 houses one substrate inside and performing plating such as copper plating on the substrate surface by immersing the substrate in a plating solution held inside. Here, the type of the plating solution is not specially limited but various plating solutions are used for purposes.

The plating apparatus 100 has a substrate holder conveying device 37 which is located laterally on these devices to convey the substrate holder along with the substrate between these devices and which employs a linear motor scheme by way of example. This substrate holder conveying device 37 is configured to convey the substrate holder between the substrate attaching/detaching mechanism 29, the prewetting bath 32, the presoaking bath 33, the prerinsing bath 34, the blowing bath 35, the rinsing bath 36 and the plating baths 39.

Figure 2:
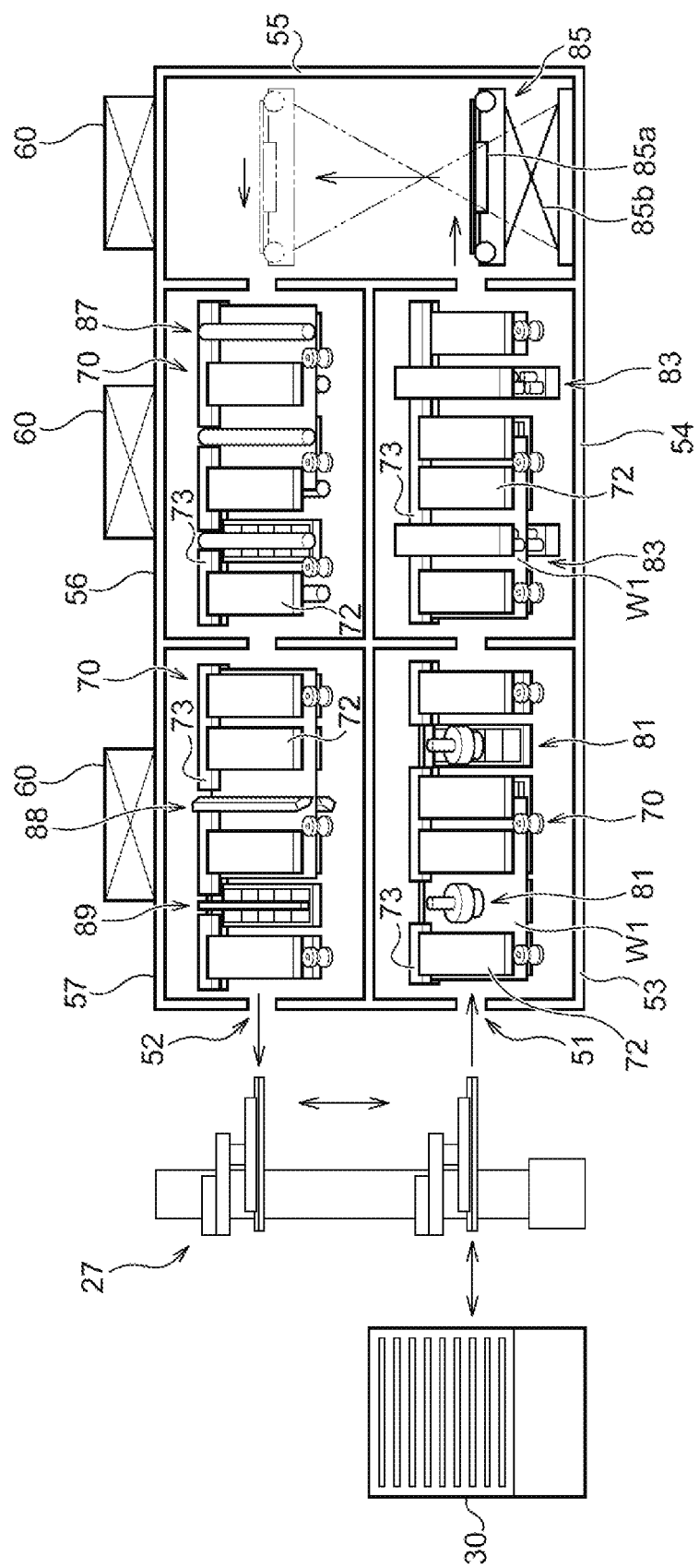
FIG. 2 is a schematic lateral cross-sectional view of a cleaning device.

Next, the cleaning device 50 shown in FIG. 1 is described in detail. FIG. 2 is a schematic lateral cross-sectional view of the cleaning device 50. FIG. 2 shows the stocker 30 and the substrate conveying device 27 shown in FIG. 1 for convenience of explanation. The cleaning device 50 shown in FIG. 2 is constituted of five chambers as a whole. Specifically, the cleaning device 50 has a first chamber 53 including an inlet port 51 for a substrate W1, a second chamber 54, a third chamber 55, a fourth chamber 56, a fifth chamber 57 including an outlet port 52 for the substrate W1. The second chamber 54 communicates with the first chamber 53 and the third chamber 55. The first chamber 53 and the second chamber 54 constitutes a first conveying path for conveying the substrate W1 in the horizontal direction. The fourth chamber 56 communicates with the third chamber 55 and the fifth chamber 57. The fourth chamber 56 and the fifth chamber 57 constitutes a second conveying path for conveying the substrate W1 in the reverse direction to that of the first conveying path. The third chamber 55 constitutes a vertical conveying path connecting the first conveying path and the second conveying path. In the present embodiment, the first conveying path composed of the first chamber 53 and the second chamber 54 is positioned below the second conveying path composed of the fourth chamber 56 and the fifth chamber 57. The arrangement of the chambers, however, is not limited to this but, for example, the first conveying path composed of the first chamber 53 and the second chamber 54 may be positioned below the second conveying path composed of the fourth chamber 56 and the fifth chamber 57. Moreover, the first conveying path and the second conveying path may be parallelly arranged in the traverse direction if the area of installing the cleaning device 50 is not strictly limited. In this case, the third chamber 55 constitutes a conveying path which connects the first conveying path and the second conveying path in the horizontal direction, and the paths form a substantial U-shape as a whole in plan view.

Hereafter, configurations of the first chamber 53 to the fifth chamber 57 are described. Inside the first chamber 53, a conveying part 70 (exemplarily corresponding to the conveying device) which conveys the substrate W1 in its inclined state, and a disc-type scrubbing device 81 (exemplarily corresponding to the treatment part) for scrubbing the substrate W1 are provided. The disc-type scrubbing device 81 includes a disc head (exemplarily corresponding to a head part) rotatably configured. A cleaning member for scrubbing the substrate W1 is provided on the surface (lower surface), of the disc head, on the side in contact with the substrate W1. As the cleaning member, for example, a circular or toroidal sheet-like member can be employed. This sheet-like member is formed, for example, of PVA (polyvinyl alcohol), and has a thickness of approximately 1 mm to 20 mm. The disc-type scrubbing device 81 has, for example, a linear guide, ball screws, servo motors and the like, which are not shown, and can move in parallel to the surface of the substrate W1.

The disc-type scrubbing device 81 removes particles adhering to the surface of the substrate W1 without damaging the surface of the substrate W1 by pressing the rotating disc head on the substrate W1 while supplying pure water or the like to the substrate W1 from a not-shown nozzle. The disc-type scrubbing device 81 can clean the substrate W1 while continuously conveying the substrate W1, or the conveying part 70 may intermittently convey the substrate W1 in order to stop conveying the substrate W1 in cleaning. Specifically, when the surface of the substrate W1 is highly polluted, the disc-type scrubbing device 81 preferably performs cleaning while stopping conveying the substrate W1. Moreover, when the surface of the substrate W1 is less polluted, the disc-type scrubbing device 81 can perform cleaning while continuously conveying the substrate W1.

While the substrate W1 is not being cleaned, for example, pure water is supplied to the cleaning member of the disc-type scrubbing device 81 from a not-shown spray nozzle with the disc-type scrubbing device 81 retracted from the conveying path of the substrate W1, in order not to cause the cleaning member to dry out. Moreover, a not-shown pure water tank may be prepared to immerse the cleaning member of the disc-type scrubbing device 81 in pure water in the tank. In this case, the pure water in the tank is preferably replaced every time when the cleaning member of the disc-type scrubbing device 81 is immersed. In the embodiment shown in the figure, two disc-type scrubbing devices 81 are arranged in the first chamber 53.

Figure 3A:
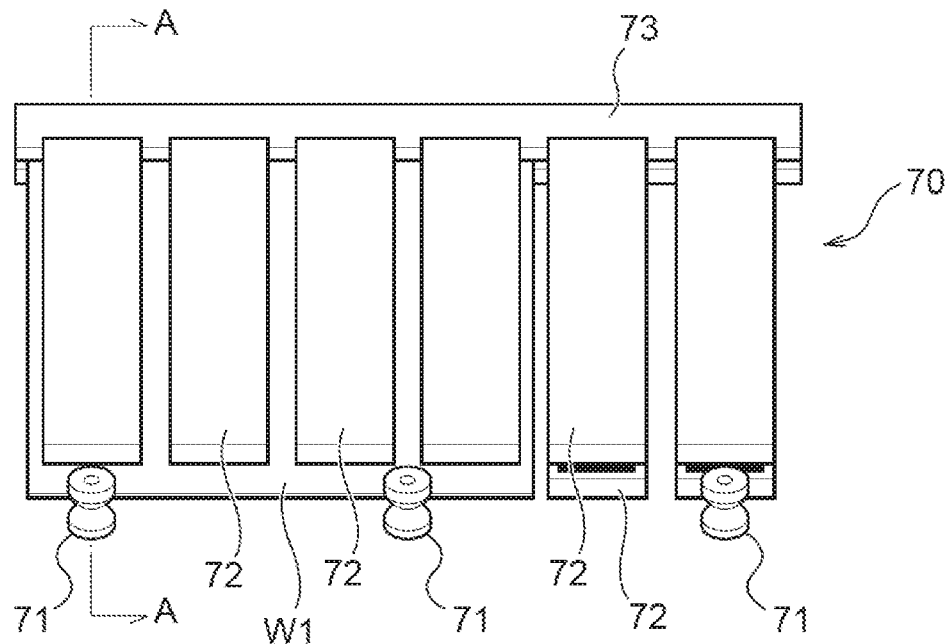
FIG. 3A is a lateral view of a conveying part.
Figure 3B:
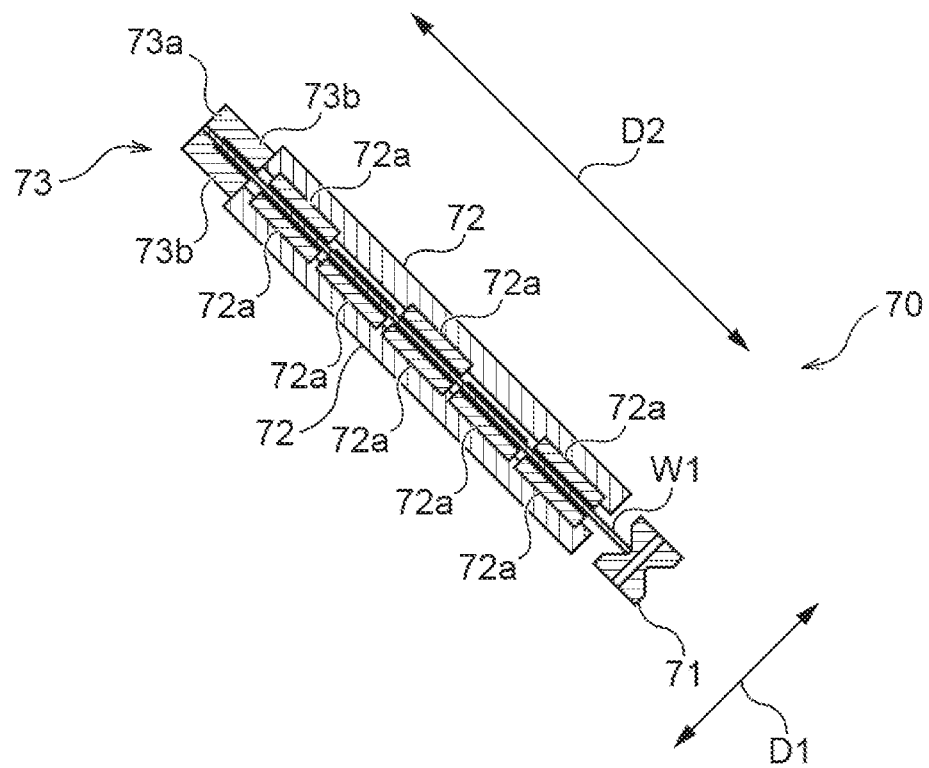
FIG. 3B is a cross-sectional view of the conveying part as seen through the arrows A-A in FIG. 3A

Specifically, the conveying part 70 conveys the substrate W1 in the state where a flat surface (which is also a treated surface) of the substrate W1 is inclined around the conveying directional axis relative to the horizontal plane. A basic configuration of the conveying part 70 is described with reference to FIG. 3A and FIG. 3B. FIG. 3A is a lateral view of the conveying part 70. FIG. 3B is a cross-sectional view of the conveying part 70 as seen through the arrows A-A in FIG. 3A. As shown in FIG. 3A and FIG. 3B, the conveying part 70 has drive parts 71, first Bernoulli chuck units 72, and a second Bernoulli chuck unit 73. The drive parts 71 are configured to apply force in the conveying direction to the substrate W1 in their physical contact with the end part of the substrate W1. In the example of FIG. 3A and FIG. 3B, the drive part 71 has a roller in contact with the lower end part of the substrate W1. The drive parts 71 rotate the rollers with a not-shown drive source to apply the force in the conveying direction to the substrate W1. The roller can be constituted of a material such as Teflon-based resin or nylon resin which hardly forms a water film at its portion in contact with the substrate W1. Moreover, the roller's contact surface with the substrate W1 may be knurled to be convex and concave, or the roller's contact surface may be formed of a porous material. Thereby, formation of water films can be suppressed to prevent slippage of the substrate W1 in conveying.

As shown in FIG. 3A, the plurality of first Bernoulli chuck units 72 are provided at arbitrary intervals along the flat surface of the substrate W1. In the first chamber 53 shown in FIG. 2, the first Bernoulli chuck units 72 are spaced form one another at arbitrary intervals such that the disc-type scrubbing devices 81 are arranged therebetween. Moreover, in the example shown in FIG. 3A and FIG. 3B, the first Bernoulli chuck units 72 are provided on both sides of the substrate W1. Nevertheless, the first Bernoulli chuck units 72 may be provided only on one side of the substrate W1.

As shown in FIG. 3B, the first Bernoulli chuck unit 72 has a plurality of first Bernoulli chucks 72a. The first Bernoulli chucks 72a are arranged so as to face the flat surfaces of the substrate W1. In the example shown in FIG. 3B, five first Bernoulli chucks 72a are provided in the first Bernoulli chuck unit 72 on one side (the lower surface side of the substrate W1), and three first Bernoulli chucks 72a are provided in the first Bernoulli chuck unit 72 on the other side (the upper surface side of the substrate W1). Any number of first Bernoulli chucks 72a may be provided in the first Bernoulli chuck unit 72. The first Bernoulli chucks 72a are pneumatic or hydraulic Bernoulli chucks, and can contactlessly hold the substrate W1 so as to limit movement of the substrate W1 in a thickness direction D1. In other words, the first Bernoulli chucks 72a cannot limit movement of the substrate W1 in an in-plane direction D2.

As shown in FIG. 3A and FIG. 3B, the second Bernoulli chuck unit 73 has a substantially U-shaped cross section, and extends in the conveying direction of the substrate W1. As shown in FIG. 3B, the second Bernoulli chuck unit 73 has a second Bernoulli chuck 73a and first Bernoulli chucks 73b. Similarly to the first Bernoulli chucks 72a, the first Bernoulli chucks 73b are arranged so as to face the flat surfaces of the substrate W1, and can hold the vicinity of the upper end part of the substrate W1 so as to limit movement of the substrate W1 in the thickness direction D1. Meanwhile, the second Bernoulli chuck 73a is arranged so as to face the end face of the upper end part of the substrate W1. The second Bernoulli chuck 73a is a pneumatic or hydraulic Bernoulli chuck, and can contactlessly hold the end face of the upper end part of the substrate W1 so as to limit movement of the substrate W1 in the in-plane direction D2. Here, the in-plane direction D2 is a direction perpendicular to the conveying direction (direction of going away from the plane of FIG. 3B) of the substrate W1.

The second Bernoulli chuck 73a of the second Bernoulli chuck unit 73 is arranged to be as long as possible along the conveying direction of the substrate W1 in order to hold the end face of the upper end part of the conveyed substrate W1 in a range as wide as possible. The second Bernoulli chuck 73a is preferably arranged to be longer along the conveying direction of the substrate W1 than the first Bernoulli chucks 72a of the first Bernoulli chuck unit 72. This can secure a space for arranging the treatment part for polishing, cleaning or drying between the first Bernoulli chucks 72a while holding the end face of the upper end part of the substrate W1 in a wide range with the second Bernoulli chuck 73a.

The conveying part 70 is configured to convey the substrate W1 in its inclined posture with the drive part 71, the first Bernoulli chuck units 72 and the second Bernoulli chuck unit 73 inclined. Specifically, the substrate W1 is conveyed in the state where it is inclined around the axis of the conveying direction (direction of going away from the plane of FIG. 3B). Note that to be "inclined" is to have an angle more than 0° and not more than 90° relative to the horizontal plane. In the example shown in FIG. 3B, the conveying part 70 conveys the substrate W1 in the posture inclined at approximately 45°. Thereby, while the area of installing the cleaning device 50 can be more reduced than in the case where the substrate W1 is conveyed in the horizontal posture, liquid draining on the surface of the substrate W1 can also be efficiently performed. The conveying part 70 preferably conveys the substrate W1 in the state where the flat surface of the substrate W1 is inclined at an angle not less than 5° and not more than 85° relative to the horizontal plane. When the substrate W1 is cleaned in the cleaning device 50 shown in FIG. 2, particles adhering to the surfaces of the substrate W1 is washed away with cleaning liquid. When the inclination angle is less than 5° in this case, the cleaning liquid containing particles hardly drops off from the substrate W1. Meanwhile, when the inclination angle is more than 85°, the cleaning liquid immediately drops off from the substrate W1, which causes a concern of drying of the substrate W1. When the substrate W1 dries out, particles contained in the cleaning liquid that still adheres to the substrate W1 are to remain on the surface of the substrate W1.

Since the conveying part 70 according to the present embodiment can hold the end face of the upper end part of the substrate W1 as above, the substrate W1 can be suppressed from bending even when the substrate W1 is conveyed in its inclined posture. Moreover, since the position of the substrate W1 in the in-plane direction D2 can be held by the second Bernoulli chuck 73a, the lower end part of the substrate W1 can be stably brought into contact with the drive parts 71 to perform conveyance at a stable speed.

Moreover, the second Bernoulli chuck 73a cannot limit movement of the substrate W1 in the thickness direction D1. Therefore, when the substrate W1 is very flexible, if the end part of the substrate W1 is displaced from the position facing the second Bernoulli chuck 73a due to its bending, the second Bernoulli chuck 73a cannot properly hold the end face of the substrate W1. The conveying part 70 according to the present embodiment, however, has the second Bernoulli chuck unit 73 with a substantially U-shaped cross section and holds the vicinity of the upper end part of the substrate W1 with the first Bernoulli chucks 73b, and hence, the end part of the substrate W1 can be prevented from bending. Therefore, even when the substrate W1 is very flexible, the end part of the substrate W1 can be held at the position facing the second Bernoulli chuck 73a, and as a result, the second Bernoulli chuck 73a can properly hold the end face of the upper end part of the substrate W1.

Moreover, with the conveying part 70 according to the present embodiment, only the lower end part of the substrate W1 is conveyed by the drive parts 71, and the upper end part thereof is held by the second Bernoulli chuck 73a. This can more reduce the number of drive parts 71 than in the case where both the lower end part and the upper end part of the substrate W1 are conveyed by the drive parts 71 such as rollers. Since the drive parts 71 come in physical contact with the substrate W1, they have to be periodically replaced due to their abrasion. Accordingly, reduction in number of drive parts 71 leads to reduction in number of drive parts 71 to be replaced, which can reduce operation costs and component costs required for the replacement. Moreover, such reduction in number of drive parts 71 can reduce the number of times of physical contact with the substrate W1 to reduce physical influence on the substrate W1. Notably, in the conveying part 70 shown in FIG. 3A, a second Bernoulli chuck unit 73 may be arranged between the drive parts 71. In such a case, the position of the substrate W1 in the in-plane direction D2 (see FIG. 3B) can be further stably maintained.

Figure 4:
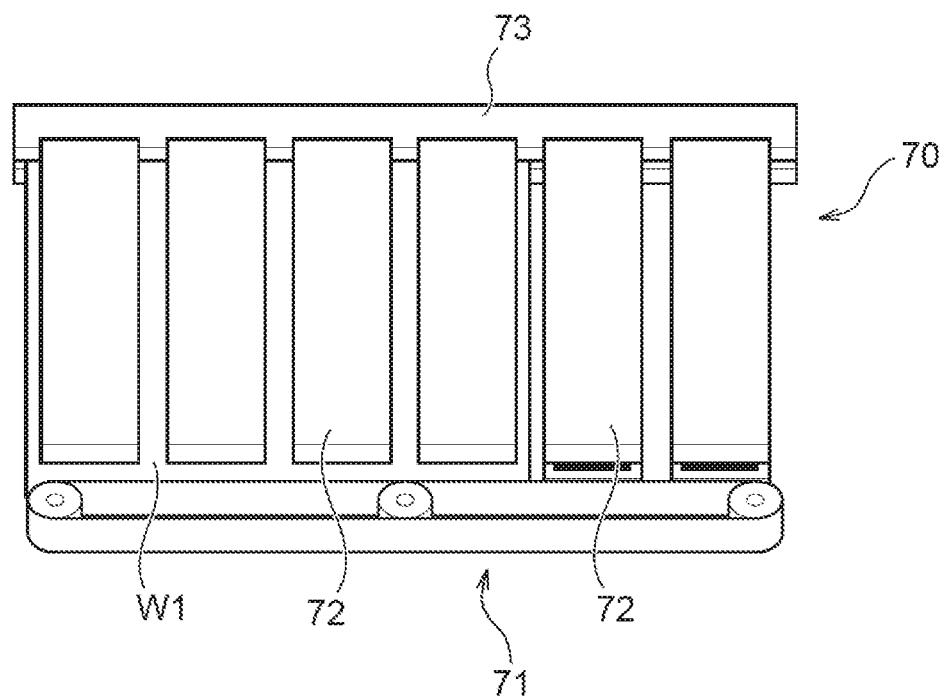
FIG. 4 is a diagram showing another mode of the conveying part.

Moreover, the drive part 71 of the conveying part 70 shown in FIG. 3A and FIG. 3B exemplarily has a roller, not limited to having the same. FIG. 4 is a diagram showing another mode of the conveying part 70. As shown in FIG. 4, the conveying part 70 may have a belt conveyer including a belt in contact with the substrate W1 as the drive part 71.

Returning to FIG. 2, the cleaning device 50 is described. As shown in FIG. 2, in the first chamber 53, the first Bernoulli chuck units 72 of the conveying part 70 are provided at positons facing the disc-type scrubbing devices 81. Thereby, a portion, of the substrate W1, on which pressure is most exerted when the surface of the substrate W1 is cleaned by the disc-type scrubbing device 81 can be held by the first Bernoulli chuck unit 72 from the opposite side to the disc-type scrubbing device 81. Accordingly, even when the disc-type scrubbing device 81 is pressed onto the substrate W1, the substrate W1 can be suppressed from bending.

In the second chamber 54, a conveying part 70 similar to the conveying part 70 of the first chamber 53, and a cleaning jet nozzle device 83 (exemplarily corresponding to the treatment part) for jet cleaning of the substrate W1 are provided. The cleaning jet nozzle device 83 has a plurality of nozzles arranged in the width direction of the substrate W1 or a single nozzle extending in the width direction of the substrate W1, and contactlessly cleans the surface of the substrate W1 by spraying cleaning liquid such as pure water onto the surface of the substrate W1. In the embodiment shown in the figure, two cleaning jet nozzle devices 83 are arranged in the first chamber 53, and each of them is configured to be able to clean both sides of the substrate W1. Notably, any number of cleaning jet nozzle devices 83 may be provided, and each of them may be configured to clean only one side of the substrate W1. The cleaning jet nozzle devices 83 are provided between the first Bernoulli chuck units 72 of the conveying part 70.

In the third chamber 55, a vertically conveying mechanism 85 which receives the substrate W1 conveyed from the second chamber 54 and conveys the substrate W1 toward the fourth chamber 56 in the vertical direction is provided. The vertically conveying mechanism 85 has, for example, a third Bernoulli chuck 85a which holds the lower surface of the substrate W1 in the horizontal posture, and a lifter 85b which lifts and lowers the third Bernoulli chuck 85a. In the third chamber 55, a not-shown rotating mechanism may be provided which rotates the substrate W1 inclined and conveyed from the second chamber 54 into the horizontal posture. The third Bernoulli chuck 85a receives the substrate W1 in the horizontal posture from this rotating mechanism and contactlessly holds the same. Moreover, in the third chamber 55, a not-shown rotating mechanism may be provided which receives the substrate W1 in the horizontal posture from the third Bernoulli chuck 85a and inclines the substrate W1. This rotating mechanism hands over the inclined substrate W1 to a conveying part 70 that is provided in the fourth chamber 56.

In the fourth chamber 56, the conveying part 70 similar to the conveying part 70 of the first chamber 53, and a roll-type scrubbing device 87 (exemplarily corresponding to the treatment part) for scrubbing the substrate W1 are provided. The roll-type scrubbing device 87 has a roll brush which comes into contact with the surface of the substrate W1. As the material of the roll brush, for example, a nylon brush, a PVA sponge, a nonwoven fabric cloth or the like can be used. The roll brush is arranged to be parallel to the surface of the substrate W1, and in cleaning the substrate W1, is controlled in its pressing pressure to be pressed onto the substrate W1 at a predetermined pressure with a spring or the like or is controlled in its position such that its distance to the substrate W1 is constant. The roll-type scrubbing device 87 prevents the roll brush from drying out, by supplying pure water to the roll brush from a not-shown pure water nozzle. The roll-type scrubbing device 87 is provided between the first Bernoulli chuck units 72 of the conveying part 70. In the embodiment shown in the figure, three roll-type scrubbing devices 87 are arranged in the fourth chamber 56.

In the fifth chamber 57, a conveying part 70 similar to the conveying part 70 of the first chamber 53, an air knife device 88 (exemplarily corresponding to the treatment part) for contactlessly drying the surface of the substrate W1, and an ionizer 89 for destaticizing the surface of the substrate W1 are provided. The air knife device 88 has, for example, a long and thin slit for ejecting compressed gas into a thin layer, and removes or dries cleaning liquid adhering to the substrate W1 by blowing both sides or one side of the substrate W1 with the compressed gas. The slit of the air knife device 88 may be arranged to be perpendicular to the width direction of the substrate W1, but preferably has an angle relative to the width direction of the substrate W1 so as to blow the cleaning liquid off toward the lower end of the substrate W1. The ionizer 89 can emit ions with a predetermined polarity onto the surface of the substrate W1 to destaticize the substrate W1. The air knife device 88 and the ionizer 89 are provided between the first Bernoulli chuck units 72 of the conveying part 70.

Since the substrate W1 is dried in the fifth chamber 57, pneumatic Bernoulli chucks are employed for the first Bernoulli chuck units 72 and the second Bernoulli chuck unit 73 of the conveying part 70 provided in the fifth chamber 57. Thereby, the conveying part 70 does not disturb drying of the substrate W1.

The upper parts of the third chamber 55, the fourth chamber 56 and the fifth chamber 57 are provided with blowing units 60 such as FFUs (Fun Filter Units) which send gas downward from the above. As the gas sent from the blowing units 60, for example, clean dry air or nitrogen can be used. Such blowing from the blowing unit 60 enables particles in the cleaning device 50 to be pressed downward, which can maintain atmospheres in the third chamber 55, the fourth chamber 56 and the fifth chamber 57 to be clean.

In each of the first chamber 53, the second chamber 54, the third chamber 55, the fourth chamber 56 and fifth chamber 57, a liquid supplying nozzle which supplies liquid such as pure water to the substrate W1 may be properly provided in order to prevent the substrate W1 from drying out.

There is described a process of cleaning the substrate W1 using the cleaning device 50 described above. First, the substrate conveying device 27 holds the substrate W1 plated in the plating apparatus 100 shown in FIG. 1. The substrate conveying device 27 inputs the substrate W1 into the first chamber 53 via the inlet port 51. In the first chamber 53, the input substrate W1 is cleaned by the disc-type scrubbing device 81 while being conveyed in its inclined state by the conveying part 70. In the cleaning by the disc-type scrubbing device 81, the substrate W1 may be cleaned while being conveyed, or the substrate W1 may be cleaned while being intermittently conveyed.

The substrate W1 cleaned at the first chamber 53 is input into the second chamber 54. In the second chamber 54, the substrate W1 is contactlessly cleaned by the cleaning jet nozzle device 83 while being conveyed in its inclined state by the conveying part 70. The substrate W1 cleaned at the second chamber 54 is input into the third chamber 55. In the third chamber 55, as to the substrate W1 received from the second chamber 54, its inclined posture is changed to the horizontal posture by a not-shown rotating mechanism, and it is handed over to the third Bernoulli chuck 85a of the vertically conveying mechanism 85. The substrate W1 is conveyed in the vertical direction by the lifter 85b while held by the third Bernoulli chuck 85a. As to the substrate W1 having been conveyed in the vertical direction, its horizontal posture is changed to the inclined posture by a not-shown rotating mechanism, and it is handed over to the conveying part 70 of the fourth chamber 56.

In the fourth chamber 56, the substrate W1 is cleaned by the roll-type scrubbing device 87 while being conveyed in its inclined state by the conveying part 70. The substrate W1 cleaned at the fourth chamber 56 is input into the fifth chamber. In the fifth chamber 57, the cleaning liquid on the surface of the substrate W1 is removed or dried by the air knife device 88 while the substrate W1 is being conveyed in its inclined state by the conveying part 70. Subsequently, after destaticized by the ionizer 89, the substrate W1 is taken out from the outlet port 52 by the substrate conveying device 27. The substrate conveying device 27 houses the cleaned and dried substrate W1 into 25a of the cassette table 25 shown in FIG. 1.

Figure 5:
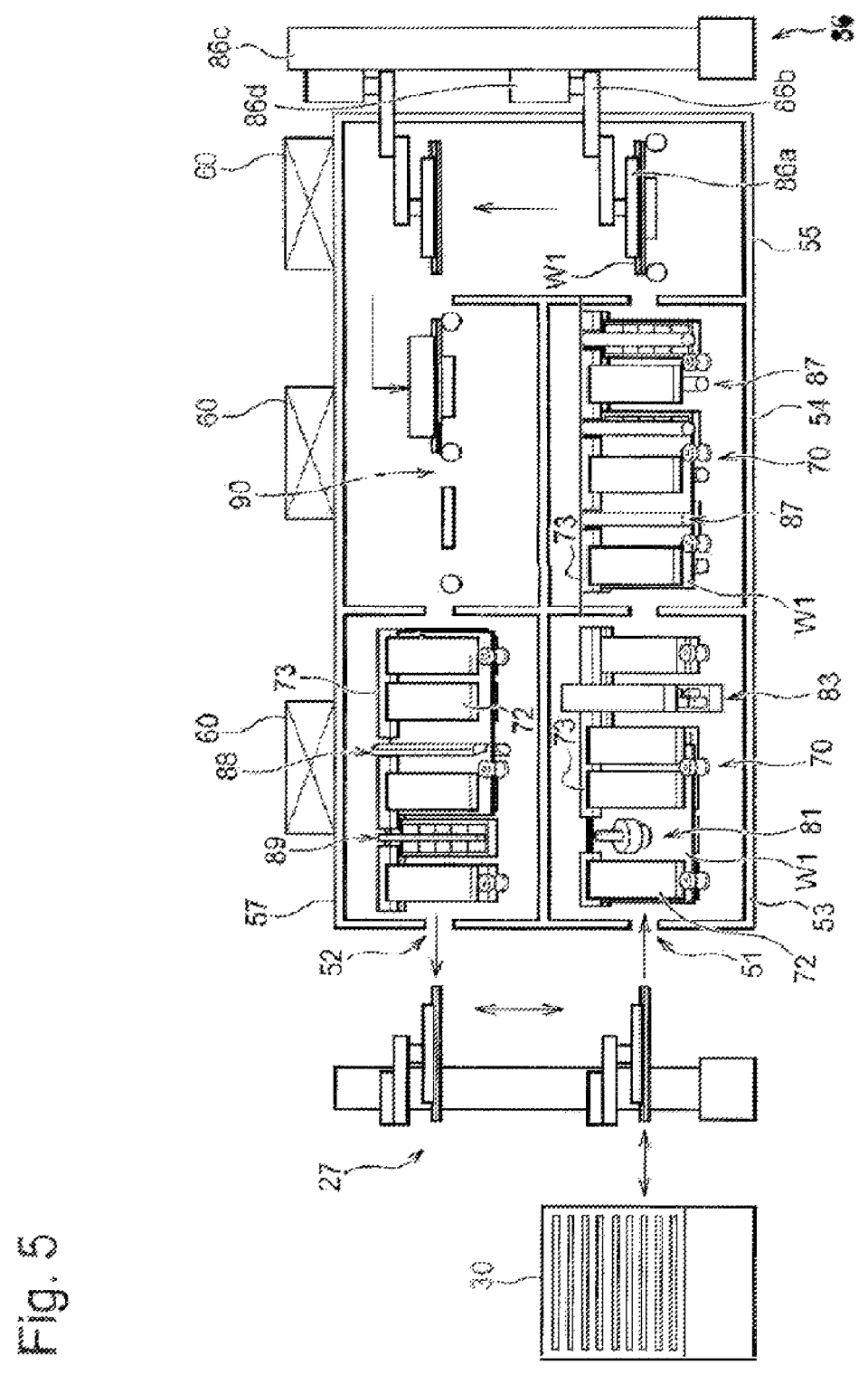

Subsequently, another exemplary configuration of the cleaning device 50 is described. FIG. 5 is a schematic lateral cross-sectional view of the cleaning device 50 according to another mode. Similarly to the cleaning device 50 shown in FIG. 2, the cleaning device 50 shown in FIG. 5 has the first chamber 53, the second chamber 54, the third chamber 55, the fourth chamber 56 and the fifth chamber 57. Since it has the similar configuration to that of the cleaning device 50 shown in FIG. 2, its differences are mainly described.

In the first chamber 53, the conveying part 70, the disc-type scrubbing device 81 and the cleaning jet nozzle device 83 are provided. In the first chamber 53, the substrate W1 is cleaned by the disc-type scrubbing device 81, and subsequently, cleaned by the cleaning jet nozzle device 83, while being conveyed in its inclined state by the conveying part 70. In the second chamber 54, the conveying part 70 and the roll-type scrubbing device 87 are provided. In the first chamber 53, the substrate W1 cleaned at the first chamber 53 is cleaned by the roll-type scrubbing devices 87 while being conveyed in its inclined state by the conveying part 70.

In the third chamber 55, a vertically conveying mechanism 86 which receives the substrate W1 conveyed from the second chamber 54 and conveys the substrate W1 toward the fourth chamber 56 in the vertical direction is provided. The vertically conveying mechanism 86 shown in FIG. 5 has a third Bernoulli chuck 86a, an arm part 86b, a support column 86c and a slider 86d. The third Bernoulli chuck 86a is configured to hold the upper surface of the substrate W1 in the horizontal posture. The arm part 86b substantially horizontally extends from the support column 86c, and holds the third Bernoulli chuck 86a. The support column 86c supports the arm part 86*b*. The slider 86*d* is configured to lift and lower the arm part 86*b* along the support column 86*c*.

As to the substrate W1 conveyed from the second chamber 54, its inclined posture is changed to the horizontal posture by a not-shown rotating mechanism, and it is handed over to the third Bernoulli chuck 86*a* of the vertically conveying mechanism 86. The slider 86*d* lifts the arm part 86*b* along the support column 86*c* to convey the substrate W1 held by the third Bernoulli chuck 86*a* in the vertical direction. Subsequently, the substrate W1 is conveyed to the fourth chamber 56.

In the fourth chamber 56, a horizontally conveying mechanism 90 which horizontally conveys the substrate W1 is provided. As the horizontally conveying mechanism 90, for example, the conveying part 70 shown in FIG. 3A and FIG. 3B can be employed. As to the conveying part 70 in this case, angles of installing the drive parts 71, the first Bernoulli chuck units 72 and the second Bernoulli chuck unit 73 are adjusted such that it can convey the substrate W1 horizontally. Otherwise, the horizontally conveying mechanism 90 may have, for example, rollers arranged so as to be in contact only with the width directional center part of the rear surface of the substrate W1 and both edge parts thereof. The substrate W1 conveyed to the fourth chamber 56 is conveyed to the fifth chamber 57 by the horizontally conveying mechanism 90. Similarly to the fifth chamber 57 shown in FIG. 2, in the fifth chamber 57, the conveying part 70, the air knife device 88 and the ionizer 89 are provided.

Figure 6:
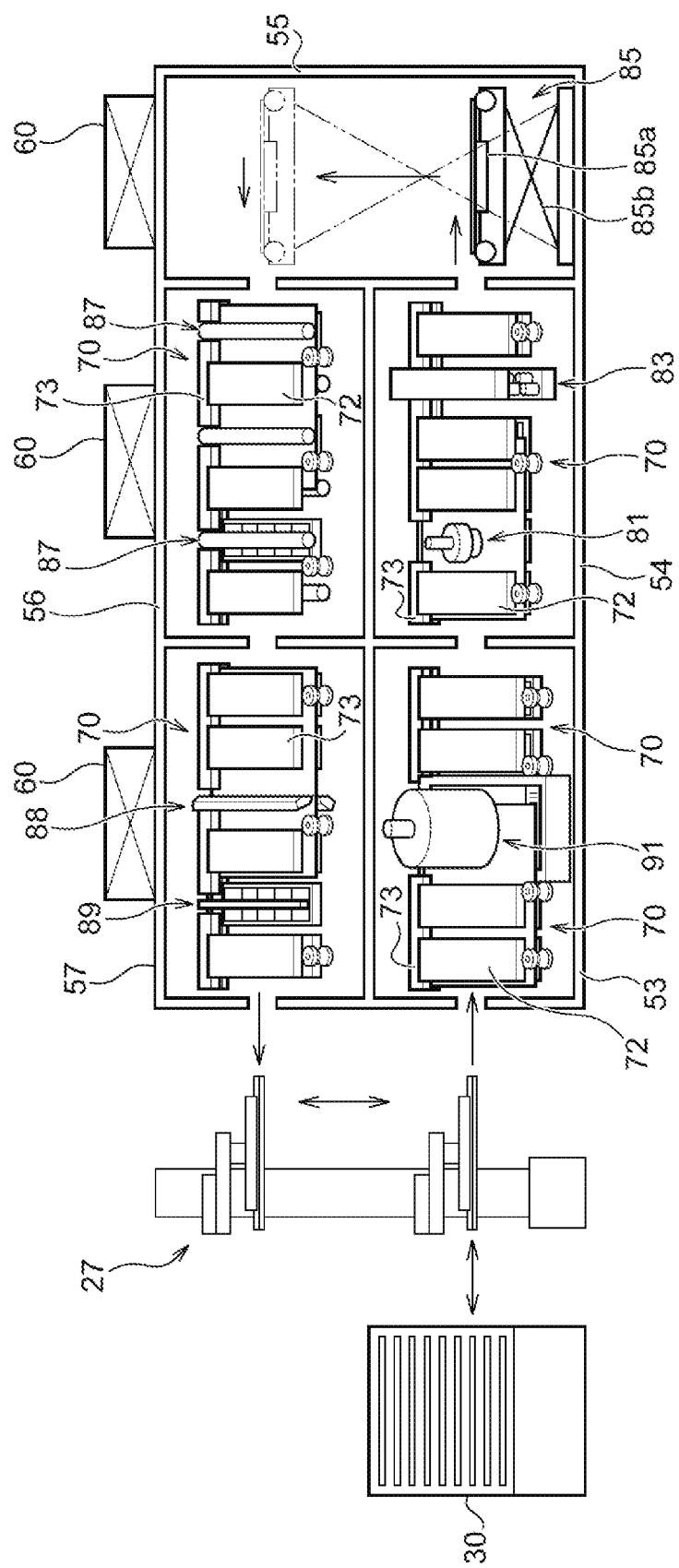
FIG. 6 is a schematic lateral cross-sectional view of the cleaning device according to another mode.

FIG. 6 is a schematic lateral cross-sectional view of the cleaning device 50 according to another mode. Similarly to the cleaning devices 50 shown in FIG. 2 and FIG. 5, the cleaning device 50 shown in FIG. 6 has the first chamber 53, the second chamber 54, the third chamber 55, the fourth chamber 56 and the fifth chamber 57. Since the cleaning device 50 shown in FIG. 6 has the similar configuration to those of the cleaning devices 50 shown in FIG. 2 and FIG. 5, its differences are mainly described.

In the first chamber 53, the conveying part 70 which conveys the substrate W1 in its inclined state, and a polishing device 91 (exemplarily corresponding to the treatment part) for polishing the substrate W1 are provided. In the first chamber 53, the first Bernoulli chuck units 72 are spaced from one another at predetermined intervals such that the polishing device 91 is arranged therebetween.

Figure 7:
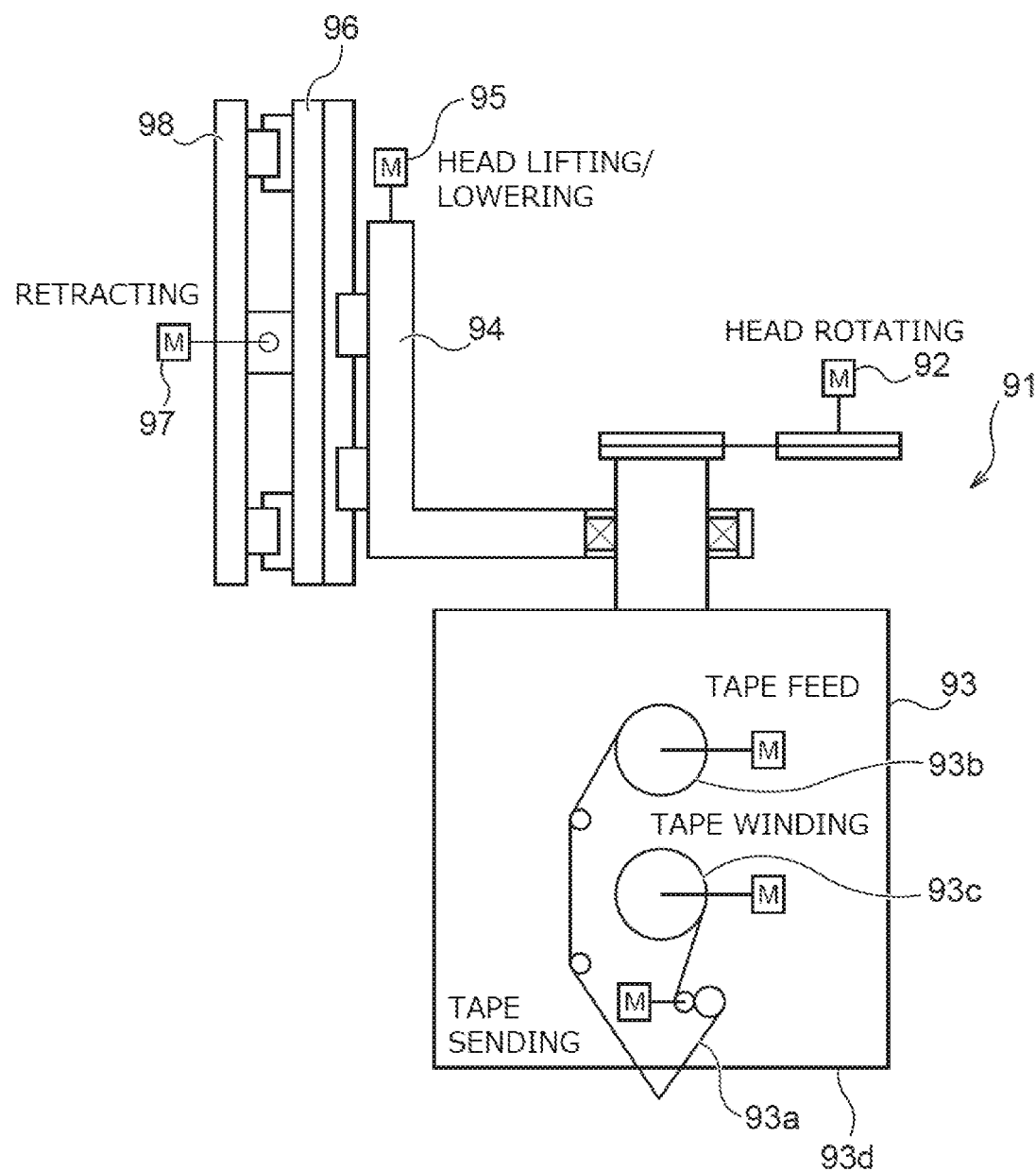
FIG. 7 is a schematic lateral cross-sectional view of a polishing device.

A specific configuration of the polishing device 91 is described. FIG. 7 is a schematic lateral cross-sectional view of the polishing device 91 shown in FIG. 6. As shown in FIG. 7, the polishing device 91 has a rotating motor 92, a polishing head 93 (exemplarily corresponding to the head part), an arm 94, a lifting/lowering motor 95, a translating plate 96, a translating motor 97 and a fixed plate 98.

The fixed plate 98 is fixed to the interior of the first chamber 53. The translating plate 96 is configured to perform translating movement relative to the surface of the fixed plate 98 with the translating motor 97. The arm 94 is attached to the translating plate 96 and configured to be lifted and lowered in a direction perpendicular to the translating direction of the translating plate 96 by the lifting/lowering motor 95. Moreover, the arm 94 rotatably holds the polishing head 93. The polishing head 93 is configured to be rotated by the rotating motor 92.

The polishing device 91 is installed to be inclined in the first chamber 53 in order to polish the inclined substrate W1 being conveyed. The translating plate 96 translates relative to the fixed plate 98, and thereby, can move the polishing head 93 parallelly to the surface of the substrate W1. Moreover, the arm 94 is moved in the direction perpendicular to the translating direction of the translating plate 96, and thereby, can move the polishing head 93 to come close to or go apart from the substrate W1. When the substrate W1 is polished, the rotating polishing head 93 is moved close to the substrate W1, and the flat surface of the substrate W1 is pressed by the polishing head 93. Moreover, during polishing, the polishing head 93 is moved parallelly to the surface of the substrate W1, and thereby, the entire surface of the substrate W1 can be polished.

The polishing head 93 has a polishing surface 93*d* facing the substrate W1, a polishing tape 93*a* provided to be exposed from the polishing surface 93*d*, a feed roller 93*b* which feeds the polishing tape 93*a*, and a winding roller 93*c* which winds the polishing tape 93*a*. The polishing tape 93*a* is configured, for example, by bonding abrasive grains such as diamond particles or SiC particles onto one side of a base film with approximately 10 mm to 60 mm of width and approximately 20 m to 100 m of length. The abrasive grains used for the polishing tape 93*a* are properly selected in accordance with the type of the substrate W1 and required polishing conditions, and are, for example, diamond particles, SiC particles or the like with an average particle diameter in a range from 0.1 $\mu$m to 5.0 $\mu$m. Moreover, the polishing tape 93*a* may be a band-shaped polishing cloth on which abrasive grains are not bonded. For the base film, for example, a flexible material can be used, such as polyester, polyurethane or polyethylene telephthalate.

The polishing tape 93*a* is fed at a predetermined speed gradually or stepwise in one direction from the feed roller 93*b* toward the winding roller 93*c* along with the polishing of the substrate W1 advancing. This allows the portion, of the polishing tape 93*a*, which is exposed from the polishing surface 93*d* to be an unused portion, and hence, the polishing tape 93*a* can be normally brought into contact with the substrate W1 all the time. While in the example shown in FIG. 7, the polishing head 93 has one set of the polishing tape 93*a*, the feed roller 93*b* and the winding roller 93*c*, it may have a plurality of sets of these.

Figure 8:
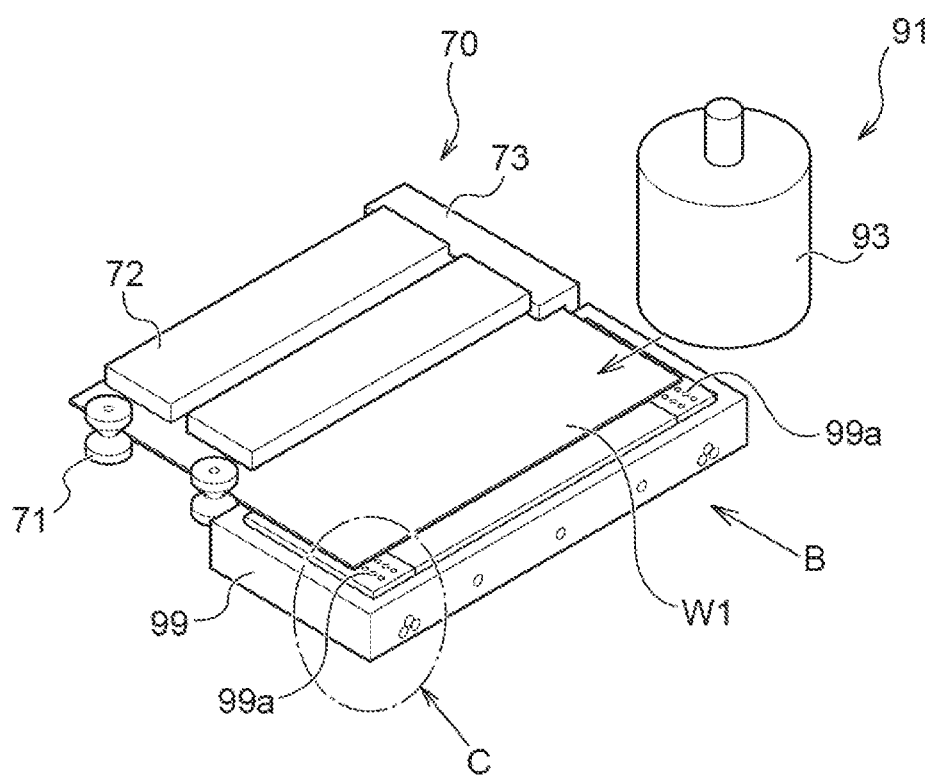
FIG. 8 is a perspective view exemplarily showing polishing of a substrate by the polishing device.

FIG. 8 is a perspective view exemplarily showing polishing of the substrate W1 by the polishing device 91. As shown in FIG. 8, a porous platen 99 including a first Bernoulli chuck unit 72 is arranged at a position facing the polishing head 93 of the polishing device 91. The porous platen 99 is formed of porous ceramics or porous carbon, and has suction holes 99*a* at positions facing both width directional end parts of the substrate W1. A not-shown vacuum source sucks air via the suction holes 99*a*, and thereby, the end parts of the substrate W1 being conveyed on the porous platen 99 are attracted onto the suction holes 99*a*. Thus, the substrate W1 can be suppressed from displacing from the first Bernoulli chuck units 72 due to friction arising in polishing the substrate W1 with the polishing head 93.

Figure 9:
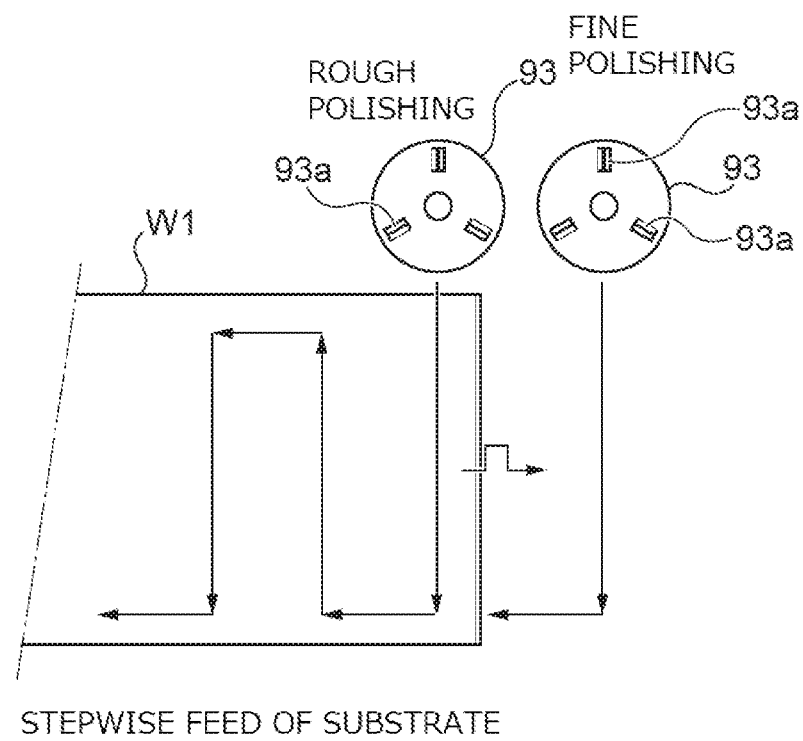
FIG. 9 is a schematic diagram exemplarily showing conveyance of a substrate and movement of a polishing head when the substrate is polished by the polishing head.
Figure 10:
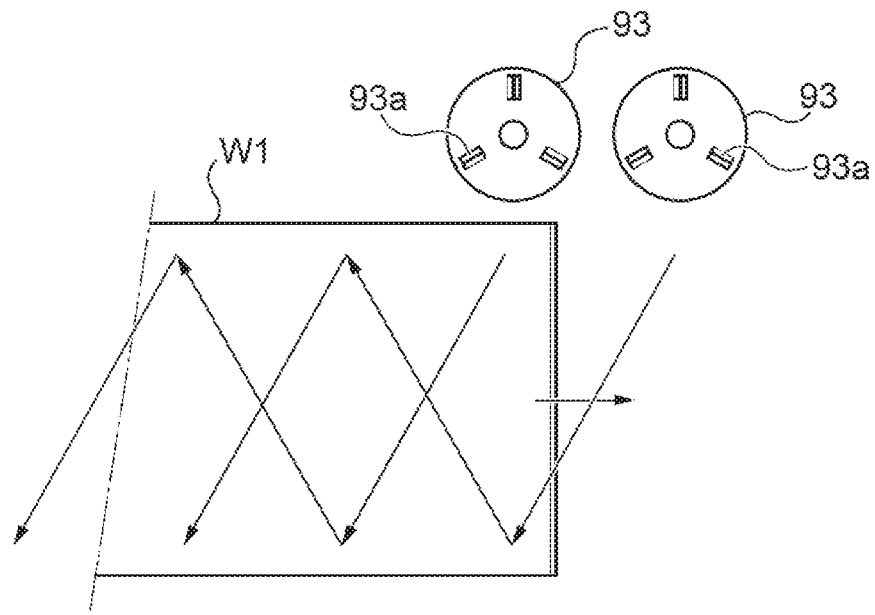
FIG. 10 is a schematic diagram exemplarily showing conveyance of a substrate and movement of a polishing head when the substrate is polished by the polishing head.

FIG. 9 and FIG. 10 are schematic diagrams exemplarily showing conveyance of the substrate W1 and movement of the polishing head 93 when the substrate W1 is polished by the polishing head 93. In the examples shown in FIG. 9 and FIG. 10, two polishing devices 91 are prepared, the polishing device 91 positioned on the upstream side in the conveying direction performs rough polishing, and the polishing device positioned on the downstream side in the conveying direction performs fine polishing (finishing polishing). In the example shown in FIG. 9, the substrate W1 is intermittently conveyed. Namely, conveyance of the substrate W1 for a predetermined distance and conveyance stop thereof for a predetermined time are repeated. In this case, the polishing heads 93 of the polishing devices 91 move in the width direction of the substrate W1 during stop of conveyance of the substrate W1, and the substrate W1 is conveyed for the predetermined distance during stop of movement of the polishing heads 93. In the example shown in FIG. 10, the substrate W1 is continuously conveyed, and the polishing heads 93 continuously move reciprocatingly. In this case, conveyance of the substrate W1 and movement of the polishing heads 93 are simultaneously performed.

Returning to FIG. 6, the cleaning device 50 is described. Similarly to the first chamber 53 shown in FIG. 5, in the second chamber 54, the conveying part 70, the disc-type scrubbing device 81 and the cleaning jet nozzle device 83 are provided. In the second chamber 54, the substrate W1 is cleaned by the disc-type scrubbing device 81, and subsequently, cleaned by the cleaning jet nozzle device 83, while being conveyed in its inclined state by the conveying part 70.

Similarly to the third chamber 55 shown in FIG. 2, in the third chamber 55, the vertically conveying mechanism 85 including the third Bernoulli chuck 85a and the lifter 85b is provided. Similarly to the fourth chamber 56 shown in FIG. 2 and the second chamber 54 shown in FIG. 5, in the fourth chamber 56, the conveying part 70 and the roll-type scrubbing devices 87 are provided. Similarly to the fifth chambers 57 shown in FIG. 2 and FIG. 5, in the fifth chamber 57, the conveying part 70, the air knife device 88 and the ionizer 89 are provided.

Figure 11:
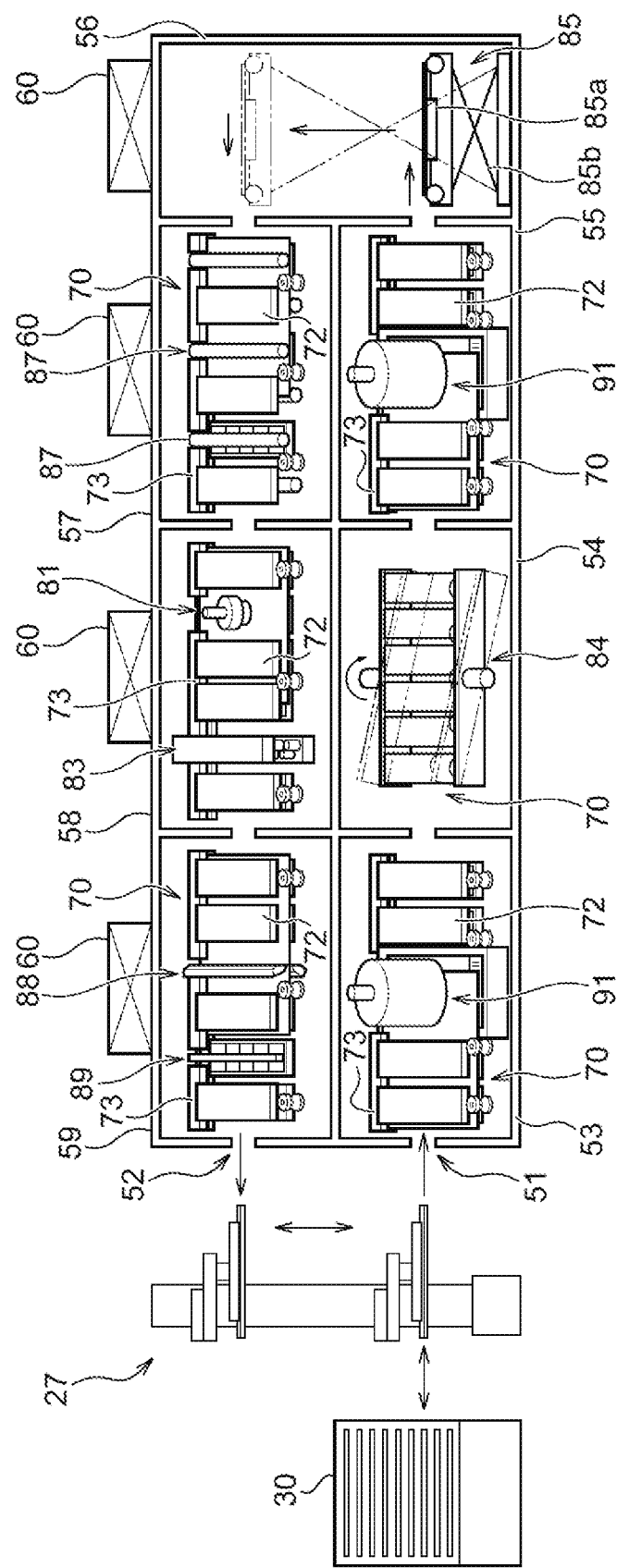
FIG. 11 is a schematic lateral cross-sectional view of the cleaning device according to another mode.

FIG. 11 is a schematic lateral cross-sectional view of the cleaning device 50 according to another mode. The cleaning device 50 shown in FIG. 11, the first chamber 53, the second chamber 54, the third chamber 55, the fourth chamber 56, the fifth chamber 57, a sixth chamber 58 and a seventh chamber 59. Since the cleaning device 50 shown in FIG. 11 has the similar configuration to those of the cleaning devices 50 shown in FIG. 2 and FIG. 5, its differences are mainly described.

Similarly to the first chamber 53 shown in FIG. 6, in the first chamber 53, the conveying part 70 which conveys the substrate W1 in its inclined state, and the polishing device 91 for polishing the substrate W1 are provided. The polishing device 91 of the first chamber 53 polishes the upper surface of the substrate W1. In the second chamber 54, a reverse mechanism 84 which reverses the substrate W1 conveyed from the first chamber 53 upside down is provided. The reverse mechanism 84 has the conveying part 70 shown in FIG. 3A and FIG. 3B. The reverse mechanism 84 holds the substrate W1 received from the first chamber 53 with the drive parts 71, the first Bernoulli chuck units 72 and the second Bernoulli chuck unit 73 of the conveying part 70 (see FIG. 3A and FIG. 3B) to reverse it upside down. The reversed substrate W1 is conveyed to the third chamber 55 by the conveying part 70.

Similarly to the first chamber 53 shown in FIG. 6, in the third chamber 55, the conveying part 70 which conveys the substrate W1 in its inclined state, and the polishing device 91 for polishing the substrate W1 are provided. The polishing device 91 in the third chamber 55 polishes the upper surface of the reversed substrate W1. Accordingly, both sides of the substrate W1 are polished by the polishing device 91 in the first chamber 53 and the polishing device 91 in the third chamber 55.

Similarly to the third chambers 55 shown in FIG. 2 and FIG. 6, in the fourth chamber 56, the vertically conveying mechanism 85 including the third Bernoulli chuck 85a and the lifter 85b is provided. Similarly to the fourth chambers 56 shown in FIG. 2 and FIG. 6 and the second chamber 54 shown in FIG. 5, in the fifth chamber 57, the conveying part 70 and the roll-type scrubbing devices 87 are provided. Similarly to the first chamber 53 shown in FIG. 5 and the second chamber 54 shown in FIG. 6, in the sixth chamber 58, the conveying part 70, the disc-type scrubbing device 81 and the cleaning jet nozzle device 83 are provided. Similarly to the fifth chambers 57 shown in FIG. 2, FIG. 5 and FIG. 6, in the seventh chamber 59, the conveying part 70, the air knife device 88 and the ionizer 89 are provided.

As described above, according to the cleaning device 50 according to the present embodiment, since the conveying part 70 conveys the substrate W1 while holding the end face of the upper end part of the substrate W1, the substrate W1 can be suppressed from bending even when the substrate W1 is conveyed in its inclined state. Moreover, as shown in FIG. 2, FIG. 5, FIG. 6 and FIG. 11, for a treatment device having various treatment parts including a cleaning treatment, a polishing treatment and a drying treatment, the substrate W1 can be appropriately conveyed by the conveying part 70 while suppressing it from bending.

Figure 12:
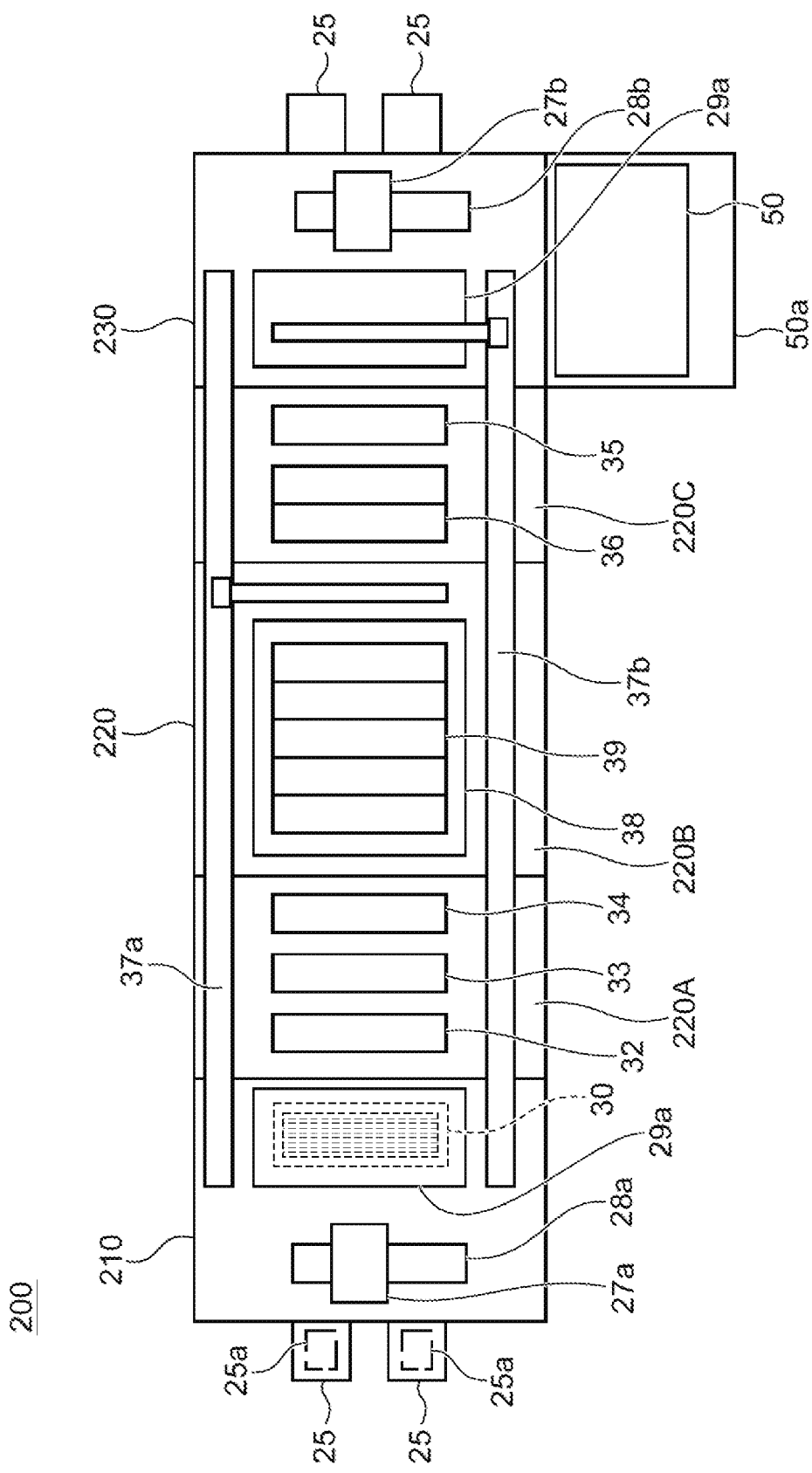
FIG. 12 is an overall arrangement diagram of another plating apparatus including the treatment device according to the present embodiment.

Another example of a plating apparatus including the treatment device according to the present embodiment is described. FIG. 12 is an overall arrangement diagram of another plating apparatus including the treatment device of the present embodiment. The plating apparatus according to the present embodiment has the cleaning device 50 as an example of the treatment device. As shown in FIG. 12, a plating apparatus 200 is roughly divided into a loading part 210 which loads substrates onto a substrate holder, a treatment part 220 in which the substrates are treated, an unloading part 230 which unloads the substrates from the substrate holder, and the cleaning part 50a. Further, the treatment part 220 includes a pre-treatment part 220A in which a pre-treatment is performed on the substrates, a plating treatment part 220B in which a plating treatment is performed on the substrates, and a post-treatment part 220C in which a post-treatment is performed on the substrates. Notably, similarly to the plating apparatus 100 shown in FIG. 1, the substrates treated by this plating apparatus 200 include rectangular substrates and circular substrates. Moreover, the rectangular substrates include rectangular printed circuit boards, other plating objects, and the like.

In the loading part 210, two cassette tables 25, a substrate attaching/detaching mechanism 29a, the stocker 30, a substrate conveying device 27a, and a travelling mechanism 28a for the substrate conveying device 27a are arranged. The substrate attaching/detaching mechanism 29a of the loading part 210 causes a not-shown substrate holder to hold substrates. The pre-treatment part 220A is arranged on the downstream side of the loading part 210. The pre-treatment part 220A includes the prewetting bath 32, the presoaking bath 33 and the prerinsing bath 34. The prewetting bath 32, the presoaking bath 33 and the prerinsing bath 34 are arranged in this order.

The plating treatment part 220B is arranged on the downstream side of the pre-treatment part 220A. The plating treatment part 220B has the plurality of plating baths 39 including the overflow bath 38. The post-treatment part 220C is arranged on the downstream side of the plating treatment part 220B. The post-treatment part 220C has the rinsing bath 36 and the blowing bath 35. The rinsing bath 36 and the blowing bath 35 are arranged in this order toward the downstream side.

The unloading part 230 is arranged on the downstream side of the post-treatment part 220C. In the unloading part 230, two cassette tables 25, a substrate attaching/detaching mechanism 29b, a substrate conveying device 27b, and a travelling mechanism 28b for the substrate conveying device 27b are arranged. The cleaning part 50a has the cleaning device 50 shown in FIG. 2. The substrate conveying device 27*b* is configured to convey the substrate subjected to a plating treatment to the cleaning device 50 and to take out the same from the cleaning device 50.

The plating apparatus 200 has substrate holder conveying devices 37*a* and 37*b* which are located laterally on those devices to convey the substrate holder along with the substrate between those devices. The substrate holder conveying devices 37*a* and 37*b* are configured to convey the substrate holder between the substrate attaching/detaching mechanisms 29*a* and 29*b*, the prewetting bath 32, the presoaking bath 33, the prerinsing bath 34, the blowing bath 35, the rinsing bath 36 and the plating baths 39. As shown in FIG. 3, when the two substrate holder conveying devices 37*a* and 37*b* are provided, one substrate holder conveying device conveys only the substrate holder that holds the substrate before the plating treatment and the other substrate holder conveying device conveys only the substrate holder that holds the substrate subjected to the plating treatment, and thereby, a standby time for handing over and receiving the substrate holder is suppressed from arising. Notably, only one of the substrate holder conveying devices 37*a* and 37*b* may be provided in the plating apparatus 200. In this case, a footprint for the plating apparatus can be reduced.

As described above, the cleaning device 50 according to the present embodiment can also be installed in the plating apparatus 200 as shown in FIG. 12 in which the loading part 210 and the unloading part 230 are arranged to be spaced from each other.

As above, some embodiments of the present invention have been described. The aforementioned embodiments of the invention are for ease of understanding the present invention and not for limiting the present invention. It is definite that the present invention can be modified or improved without departing from the spirit thereof and that the present invention includes its equivalents. Moreover, any combinations or omissions of the components described in the claims and the specification can occur as long as at least part of the aforementioned problems can be solved or at least part of the aforementioned effects can be achieved.

Some aspects disclosed by the present specification are described below.

According to a first aspect, a treatment device is provided. This treatment device has: a conveying part that conveys a workpiece in a state where a flat surface of the workpiece is inclined around a conveying directional axis relative to a horizontal plane; and a treatment part in which at least one of polishing, cleaning and drying is performed on the flat surface of the workpiece. The conveying part has: a drive part configured to be brought into physical contact with an end part of the workpiece and apply force in a conveying direction to the workpiece; a first Bernoulli chuck arranged to face the flat surface of the workpiece; and a second Bernoulli chuck arranged to face an end face of an opposite end part to the end part of the workpiece.

According to the first aspect, since the second Bernoulli chuck is arranged to face the end face of the workpiece, the end face of the end part of the workpiece can be held. Therefore, even when the workpiece is conveyed in its inclined posture, the workpiece can be suppressed from bending. Moreover, since the workpiece can be held at a position in the in-plane direction by the second Bernoulli chuck, the lower end part of the workpiece can be stably brought into contact with the drive part, and it can be stably conveyed.

The second Bernoulli chuck cannot limit movement of the workpiece in the thickness direction. Therefore, if the workpiece is very flexible, assuming that the end part of the workpiece bends and is displaced from the position facing the second Bernoulli chuck, the second Bernoulli chuck cannot appropriately hold the end face of the workpiece. According to the first aspect, the first Bernoulli chuck, however, is arranged to face the flat surface of the workpiece, hence, movement of the workpiece in the thickness direction can be limited, and the end part of the workpiece can be prevented from bending. Therefore, even when the workpiece is very flexible, the end part of the workpiece can be held at the position facing the second Bernoulli chuck, and as a result, the second Bernoulli chuck can appropriately hold the end face of the end part of the workpiece.

Moreover, according to the first aspect, one end part of the workpiece is conveyed by the drive part, and the opposite end part thereto is held by the second Bernoulli chuck. Therefore, the number of drive parts can be more reduced than in the case where both the lower end part and the upper end part of the workpiece are conveyed by drive parts such as rollers. Since the drive part is in physical contact with the workpiece, it has to be periodically replaced due to its abrasion. Accordingly, reduction in number of drive parts leads to reduction in number of drive parts to be replaced, which can reduce operation costs and component costs required for the replacement. Moreover, such reduction in number of drive parts can reduce the number of times of physical contact with a treated part and a contact time therewith to reduce physical influence on the treated part.

According to a second aspect, in the treatment device of the first aspect, the conveying part is configured to convey the workpiece in a state where the flat surface of the workpiece is inclined at an angle not less than 5° and not more than 85° relative to a horizontal plane.

When the treatment device performs a treatment using liquid on a workpiece, particles adhering to the surface of the workpiece are washed away with the liquid. When the inclination angle of the workpiece is less than 5° in this stage, the liquid containing particles hardly drops off from the workpiece. Meanwhile, when the inclination angle is more than 85°, the liquid immediately drops off from the workpiece, which causes a concern of drying of the workpiece. When the workpiece dries out, particles contained in the cleaning liquid that still adheres to the workpiece are to remain on the surface of the workpiece. Therefore, according to the second aspect, the workpiece can be suppressed from drying out while the liquid containing particles is allowed to drop off.

According to a third aspect, in the treatment device of the first or second aspect, a plurality of the first Bernoulli chucks arranged to face both surfaces of the workpiece are included.

According to the third aspect, since both sides of the workpiece can be held by the first Bernoulli chucks, movement of the workpiece in the thickness direction can be further securely limited.

According to a fourth aspect, in the treatment device of any one of the first to third aspects, a plurality of the first Bernoulli chucks arranged along the conveying direction of the workpiece are included, wherein the treatment part is arranged between the plurality of the first Bernoulli chucks arranged along the conveying direction of the workpiece.

According to the fourth aspect, since the treatment part is arranged between the first Bernoulli chucks, the first Bernoulli chucks can hold both sides of a portion, of the workpiece, that is treated by the treatment part, the treatment by the treatment part can be stably performed.

According to a fifth aspect, in the treatment device of any one of the first to fourth aspects, the second Bernoulli chuck is longer in the conveying direction of the workpiece than the first Bernoulli chuck.

According to the fifth aspect, a space for arranging the treatment part for performing polishing, cleaning or drying between the first Bernoulli chucks while holding the end face of the workpiece in a wide range with the second Bernoulli chuck.

According to a sixth aspect, in the treatment device of any one of the first to fifth aspects, the first Bernoulli chuck is arranged at a position on an opposite side of the workpiece from the treatment part.

According to the sixth mode, a portion, of the workpiece, on which pressure is most exerted when the surface of the substrate W1 is treated by the treatment part can be held by the first Bernoulli chucks from the opposite side to the treatment part. Accordingly, even when the treatment part is pressed on the workpiece, the workpiece can be suppressed from bending.

According to a seventh aspect, in the treatment device according to any one of the first to sixth aspects, an inlet port for a workpiece, an outlet port for the workpiece, a first conveying path on which the workpiece input from the inlet port is conveyed, a second conveying path on which the workpiece is conveyed in a reverse direction to a direction in which the workpiece is conveyed on the first conveying path and which communicates with the first conveying path and the outlet port, a vertical conveying path that connects the first conveying path and the second conveying path, and a vertically conveying mechanism that conveys the workpiece on the vertical conveying path in a vertical direction from the first conveying path toward the second conveying path.

According to the seventh aspect, since the workpiece is conveyed in the reverse directions on the first conveying path and the second conveying path, the first conveying path and the second conveying path form a reciprocating path, which can secure a sufficient path length while reducing the length of the cleaning device as a whole. Moreover, since the first conveying path and the second conveying path form the reciprocating path, the inlet port and the outlet port can be arranged to be close to each other. Thereby, one workpiece conveying device can input the workpiece into the inlet port and take out the workpiece from the outlet port without its long movement.

According to an eighth aspect, in the treatment device of the seventh aspect, the vertically conveying mechanism has a third Bernoulli chuck configured to contactlessly hold the workpiece. According to the eighth aspect, the workpiece can be contactlessly and vertically conveyed.

According to a ninth aspect, a plating apparatus including the treatment device of any one of the first to seventh aspects is provided. This plating apparatus includes: a plating treatment part; and a substrate conveying part. The substrate conveying part is configured to input the workpiece subjected to a plating treatment in the plating treatment part into an inlet port of the treatment device and to take out the workpiece treated by the treatment device from the outlet port.

According to a tenth aspect, a treatment method is provided. This treatment method includes: a step of conveying a workpiece in a state where a flat surface of the workpiece is inclined around a conveying directional axis relative to a horizontal plane; and a treatment step of performing at least one of polishing, cleaning and drying on the flat surface of the workpiece. The step of conveyance includes a step of physically applying force in a conveying direction to an end part of the workpiece, a step of holding the flat surface of the workpiece with a first Bernoulli chuck so as to limit movement of the workpiece in a thickness direction, and a step of holding an end face of an opposite end part to the end part of the workpiece with a second Bernoulli chuck so as to limit movement of the workpiece in an in-plane direction perpendicular to the conveying direction.

According to the tenth aspect, the second Bernoulli chuck can hold the end face of the end part of the workpiece. Therefore, even when the workpiece is conveyed in its inclined posture, the workpiece can be suppressed from bending. Moreover, since the second Bernoulli chuck can hold the workpiece at a position in the in-plane direction, the lower end part of the workpiece can be stably brought into contact with the drive part, and it can be stably conveyed.

The second Bernoulli chuck cannot limit movement of the workpiece in the thickness direction. Therefore, if the workpiece is very flexible, assuming that the end part of the workpiece bends and is displaced from the position facing the second Bernoulli chuck, the second Bernoulli chuck cannot appropriately hold the end face of the workpiece. According to the tenth aspect, the first Bernoulli chuck, however, holds the flat surface of the workpiece, hence, movement of the workpiece in the thickness direction can be limited, and the end part of the workpiece can be prevented from bending. Therefore, even when the workpiece is very flexible, the end part of the workpiece can be held at the position facing the second Bernoulli chuck, and as a result, the second Bernoulli chuck can appropriately hold the end face of the end part of the workpiece.

Moreover, according to the tenth aspect, force in the conveying direction is physically applied to one end part of the workpiece, and the opposite end part thereto is held by the second Bernoulli chuck. Therefore, the number of times of physical contact with the treated part and a contact time therewith can be more reduced than in the case where force is physically applied to both the lower end part and the upper end part of the workpiece, which can reduce physical influence on the treated part.

According to an eleventh aspect, in the treatment method of the tenth aspect, the step of conveyance includes a step of conveying the workpiece in a state where the flat surface of the workpiece is inclined at an angle not less than 5° and not more than 85° relative to the horizontal plane.

When a treatment using liquid is performed on the workpiece, particles adhering to the surface of the workpiece are washed away. When the inclination angle of the workpiece is less than 5° in this stage, the liquid containing particles hardly drops off from the workpiece. Meanwhile, when the inclination angle is more than 85°, the liquid immediately drops off from the workpiece, which causes a concern of drying of the workpiece. When the workpiece dries out, particles contained in the cleaning liquid that still adheres to the workpiece are to remain on the surface of the workpiece. Therefore, according to the eleventh aspect, the workpiece can be suppressed from drying out while the liquid containing particles is allowed to drop off.

According to a twelfth aspect, in the treatment method of the tenth to eleventh aspects, the step of holding with the first Bernoulli chuck has a step of holding both sides of the workpiece with a plurality of the first Bernoulli chucks.

According to the twelfth aspect, since both side of the workpiece can be held by the first Bernoulli chucks, movement of the workpiece in the thickness direction can be further limited.

According to a thirteenth aspect, in the treatment method of any one of the tenth to twelfth aspects, the step of conveyance has a step of conveying the workpiece through a first conveying path, a vertically conveying step of conveying the workpiece in a vertical direction from the first conveying path toward a second conveying path, and a step of conveying the workpiece through the second conveying path. In the vertically conveying step, the workpiece is conveyed while being contactlessly held using a third Bernoulli chuck. According to the thirteenth aspect, in a vertical conveying path from the first conveying path toward the second conveying path, the workpiece can be contactlessly conveyed in the vertical direction.

According to a fourteenth aspect, in the treatment method of any one of the tenth to thirteenth aspects, the treatment step of performing at least one of polishing, cleaning and drying includes a step of performing it while pressing, onto the flat surface of the workpiece, a tape member which is held by a head part and fed at a predetermined speed in one direction.

According to a fifteenth aspect, in the treatment method of any one of the tenth to fourteenth aspects, the treatment step of performing at least one of polishing, cleaning and drying includes a step of performing it while pressing, onto the flat surface of the workpiece, a sheet-like member held by a head part.

According to a sixteenth aspect, there is provided a conveying device which conveys a workpiece in a state where a flat surface of the workpiece is inclined around a conveying directional axis relative to a horizontal plane. This conveying device includes: a drive part configured to be brought into physical contact with an end part of the workpiece and apply force in a conveying direction to the workpiece; a first Bernoulli chuck arranged to face the flat surface of the workpiece; and a second Bernoulli chuck arranged to face an end face of an opposite end part to the end part of the workpiece.

According to the sixteenth aspect, since the second Bernoulli chuck is arranged to face the end face of the workpiece, it can hold the end face of the end part of the workpiece. Therefore, even when the workpiece is conveyed in its inclined posture, the workpiece can be suppressed from bending. Moreover, since the second Bernoulli chuck can hold the workpiece at a position in the in-plane direction, the lower end part of the workpiece can be stable brought into contact with the drive part, and it can be stably conveyed.

The second Bernoulli chuck cannot limit movement of the workpiece in the thickness direction. Therefore, if the workpiece is very flexible, assuming that the end part of the workpiece bends and is displaced from the position facing the second Bernoulli chuck, the second Bernoulli chuck cannot appropriately hold the end face of the workpiece. According to the sixteenth aspect, the first Bernoulli chuck, however, is arranged to face the flat surface of the workpiece, hence, movement of the workpiece in the thickness direction can be limited, and the end part of the workpiece can be prevented from bending. Therefore, even when the workpiece is very flexible, the end part of the workpiece can be held at the position facing the second Bernoulli chuck, and as a result, the second Bernoulli chuck can appropriately hold the end face of the end part of the workpiece.

Moreover, according to the sixteenth aspect, one end part of the workpiece is conveyed by the drive part, and the opposite end part thereto is held by the second Bernoulli chuck. Therefore, the number of drive part can be more reduced than in the case where both the lower end part and the upper end part of the workpiece are conveyed by drive parts such as rollers. Since the drive part is in physical contact with the workpiece, suffering abrasion, it has to be periodically replaced. Accordingly, reduction in number of drive parts leads to reduction in number of drive parts to be replaced, which can reduce operation costs and component costs required for the replacement. Moreover, such reduction in number of drive parts can reduce the number of times of physical contact with the treated part and a contact time therewith to reduce physical influence on the treated part.

REFERENCE SIGNS LIST 27, 27a, 27b Substrate conveying device
50 Cleaning device
51 Inlet port
52 Outlet port
70 Conveying part
71 Drive part
72a First Bernoulli chuck
73a Second Bernoulli chuck
73b First Bernoulli chuck
81 Disc-type scrubbing device
83 Cleaning jet nozzle device
85 Vertically conveying mechanism
85a, 86a Third Bernoulli chuck
86 Vertically conveying mechanism
87 Roll-type scrubbing device
88 Air knife device
89 Ionizer
90 Horizontally conveying mechanism
91 Polishing device
93 Polishing head
93a Polishing tape
100, 200 Plating apparatus
120B, 220B Plating treatment part

The invention claimed is:

1. A treatment device comprising:
   a conveying part that conveys a workpiece in a state where a flat surface of the workpiece is inclined around a conveying directional axis relative to a horizontal plane; and
   a treatment part in which at least one of polishing, cleaning and drying is performed on the flat surface of the workpiece, wherein
   the conveying part has
   a drive part configured to be brought into physical contact with an end part of the workpiece and apply force in a conveying direction to the workpiece,
   a first Bernoulli chuck arranged to face the flat surface of the workpiece such that the first Bernoulli chuck contactlessly holds the flat surface of the workpiece so as to limit movement of the workpiece in a thickness direction of the workpiece, and
   a second Bernoulli chuck arranged to face an end face of an opposite end part to the end part of the workpiece such that the second Bernoulli chuck contactlessly holds the end face of the workpiece so as to limit movement of the workpiece in an in-plane direction of the workpiece, the in-plane direction being perpendicular to the conveying direction of the workpiece.

2. The treatment device according to claim 1, wherein the conveying part is configured to convey the workpiece in a state where the flat surface of the workpiece is inclined at an angle not less than 5° and not more than 85° relative to the horizontal plane.

3. The treatment device according to claim 1, comprising a plurality of the first Bernoulli chucks arranged to face both surfaces of the workpiece.

4. The treatment device according to claim 1, comprising a plurality of the first Bernoulli chucks arranged along the conveying direction of the workpiece, wherein
the treatment part is arranged between the plurality of the first Bernoulli chucks arranged along the conveying direction of the workpiece.

5. The treatment device according to claim 1, wherein the second Bernoulli chuck is longer in the conveying direction of the workpiece than the first Bernoulli chuck.

6. The treatment device according to claim 1, wherein the first Bernoulli chuck is arranged at a position on an opposite side of the workpiece from the treatment part.

7. The treatment device according to claim 1, comprising:
an inlet port for a workpiece;
an outlet port for the workpiece;
a first conveying path on which the workpiece from the inlet port is conveyed;
a second conveying path on which the workpiece is conveyed in a reverse direction to a direction in which the workpiece is conveyed on the first conveying path and which communicates with the first conveying path and the outlet port;
a vertical conveying path that connects the first conveying path and the second conveying path; and
a vertically conveying mechanism that conveys the workpiece on the vertical conveying path in a vertical direction from the first conveying path toward the second conveying path.

8. The treatment device according to claim 7, wherein the vertically conveying mechanism has a third Bernoulli chuck configured to contactlessly hold the workpiece.

9. The treatment device according to claim 1, wherein, with respect to the in-plane direction, the first Bernoulli chuck is positioned between the drive part and the second Bernoulli chuck.

10. The treatment device according to claim 9, wherein the first Bernoulli chuck cannot limit movement of the substrate in the in-plane direction.

11. A plating apparatus including the treatment device according to claim 1, the apparatus comprising:
a plating treatment part; and
a substrate conveying part, wherein
the substrate conveying part is configured to input the workpiece subjected to a plating treatment in the plating treatment part into an inlet port of the treatment device and to take out the workpiece treated by the treatment device from the outlet port.

12. A treatment method comprising:
a step of conveying a workpiece in a state where a flat surface of the workpiece is inclined around a conveying directional axis relative to a horizontal plane; and
a treatment step of performing at least one of polishing, cleaning and drying on the flat surface of the workpiece, wherein
the step of conveyance includes
physically applying force in a conveying direction to an end part of the workpiece,
contactlessly holding the flat surface of the workpiece with a first Bernoulli chuck so as to limit movement of the workpiece in a thickness direction of the workpiece, and
contactlessly holding an end face of an opposite end part to the end part of the workpiece with a second Bernoulli chuck so as to limit movement of the workpiece in an inplane direction of the workpiece, the in-plane direction being perpendicular to the conveying direction of the workpiece.

13. The treatment method according to claim 12, wherein the step of conveyance includes conveying the workpiece in a state where the flat surface of the workpiece is inclined at an angle not less than 5° and not more than 85° relative to the horizontal plane.

14. The treatment method according to claim 12, wherein the contactlessly holding with the first Bernoulli chuck includes a step of holding both sides of the workpiece with a plurality of the first Bernoulli chucks.

15. The treatment method according to claim 12, wherein the step of conveyance includes
conveying the workpiece through a first conveying path,
vertically conveying the workpiece in a vertical direction from the first conveying path toward a second conveying path, and
conveying the workpiece through the second conveying path, and
in the vertically conveying, the workpiece is conveyed while being contactlessly held using a third Bernoulli chuck.

16. The treatment method according to claim 12, wherein the treatment step of performing at least one of polishing, cleaning and drying includes performing at least one of polishing, cleaning and drying while pressing, onto the flat surface of the workpiece, a tape member which is held by a head part and fed at a predetermined speed in one direction.

17. The treatment method according to claim 12, wherein the treatment step of performing at least one of polishing, cleaning and drying includes performing at least one of polishing, cleaning and drying while pressing, onto the flat surface of the workpiece, a sheet-like member held by a head part.

* * * * *